(12) United States Patent
Hasegawa

(10) Patent No.: US 6,515,525 B2
(45) Date of Patent: Feb. 4, 2003

(54) FRACTIONAL-N-PLL FREQUENCY SYNTHESIZER AND PHASE ERROR CANCELING METHOD THEREFOR

(75) Inventor: Morihito Hasegawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/809,208

(22) Filed: Mar. 16, 2001

(65) Prior Publication Data

US 2001/0052804 A1 Dec. 20, 2001

(30) Foreign Application Priority Data

Jun. 15, 2000 (JP) ........................................ 2000-179470

(51) Int. Cl.[7] .............................................. H03L 7/06
(52) U.S. Cl. ........................ 327/156; 327/159; 331/1 A; 331/17
(58) Field of Search ................................ 327/156, 157, 327/159; 323/17, 34, 36 C, 36 L, 1 A, DIG. 2

(56) References Cited

U.S. PATENT DOCUMENTS

| | | | | |
|---|---|---|---|---|
| 4,267,601 A | * | 5/1981 | Umeda et al. | 455/165 |
| 4,965,531 A | * | 10/1990 | Riley | 331/1 A |
| 5,576,666 A | * | 11/1996 | Rauvola | 331/25 |
| 5,818,303 A | * | 10/1998 | Oishi et al. | 331/1 A |
| 5,834,987 A | * | 11/1998 | Dent | 332/127 |
| 5,847,611 A | * | 12/1998 | Hirata | 331/1 A |
| 6,236,275 B1 | * | 5/2001 | Dent | 331/1 A |

FOREIGN PATENT DOCUMENTS

JP  11-225072  8/1999

* cited by examiner

Primary Examiner—Timothy P. Callahan
Assistant Examiner—An T. Luu
(74) Attorney, Agent, or Firm—Arent Fox Kintner Plotkin & Kahn

(57) ABSTRACT

A fractional-N-PLL frequency synthesizer that reduces the spurious caused by a phase error is provided. A reference phase error is determined from a plurality of phase errors generated between a reference signal and a comparison signal when the fractional-N-PLL frequency synthesizer is locked. Then, any phase error equal to or smaller than the reference phase error is canceled.

16 Claims, 5 Drawing Sheets

FRACTIONAL-N-PLL FREQUENCY SYNTHESIZER AND PHASE ERROR CANCELING METHOD THEREFOR

BACKGROUND OF THE INVENTION

The present invention relates to a frequency synthesizer and, more particularly, to a fractional-N-PLL frequency synthesizer and a phase error canceling method therefor.

Recent mobile communication devices use a fractional division (fractional-N) frequency synthesizer that has an excellent fast channel switching capability. As shown in FIG. 1, the fractional-N PLL frequency synthesizer 50 includes a phase comparator 51, a charge pump 52, a low-pass filter (LPF) 53, a voltage controlled oscillator (VCO) 54, a variable frequency divider 55a and an accumulator 55b.

The phase comparator 51 compares the phase of a reference signal fr with the phase of a comparison signal fp and provides the resulting phase difference signals ΦR and ΦP to the charge pump 52. The charge pump 52 generates a voltage signal Do according to the phase difference signals ΦR and ΦP and provides the voltage signal Do to the LPF 53. The LPF 53 smoothes the voltage signal Do from the charge pump 52 and provides the VCO 54 with a control voltage signal from which a high-frequency component has been removed.

The VCO 54 generates a frequency signal fvco according to the voltage value of the control voltage signal and provides the frequency signal fvco to the variable frequency divider 55a. The variable frequency divider 55a frequency-divides the frequency signal fvco while changing the frequency dividing ratio from M division to M+1 division every time an overflow signal OVF is supplied from the accumulator 55b, and provides the comparison signal fp to the phase comparator 51.

The fractional-N-PLL frequency synthesizer 50 is able to change the frequency signal fvco in finer steps than the reference signal fr. However, since the fractional-N-PLL frequency synthesizer 50 performs fractional division (averaging of a frequency divided value) in an equivalent manner, a phase error is generated. FIG. 2 is a timing chart of the reference signal fr and the comparison signal fp. In this example, the fractional-N-PLL frequency synthesizer performs frequency division of 1/8 and is locked. The reference signal fr is 200 kHz and the frequency signal fvco is 800.025 MHz.

Even in the locked state, as apparent in FIG. 2, phase errors Δt0 to Δt7 are generated between the reference signal fr and the comparison signal fp in a cycle of 25 kHz. Specifically, suppose that the phase error Δt0 between the reference signal fr and comparison signal fp whose phases match with each other is 0.000 nanoseconds (ns). The first phase error Δt1 between the following reference signal fr and comparison signal fp is 1.094 ns, the second phase error Δt2 between thereafter reference signal fr and comparison signal fp is 0.938 ns, the third phase error Δt3 between thereafter reference signal fr and comparison signal fp is 0.782 ns, the fourth phase error Δt4 between thereafter reference signal fr and comparison signal fp is 0.626 ns, the fifth phase error Δt5 between thereafter reference signal fr and comparison signal fp is 0.470 ns, the sixth phase error Δt6 between thereafter reference signal fr and comparison signal fp is 0.314 ns, and the seventh phase error Δt7 between thereafter reference signal fr and comparison signal fp is 0.158 ns. Then, the phases of the next reference signal fr and comparison signal fp match with each other, so that the phase error Δt0 returns to 0.000 ns. Thereafter, the phase errors Δt0 to Δt7 are cyclically generated between the reference signal fr and the comparison signal fp.

When the fractional-N-PLL frequency synthesizer 50 is locked, the phase errors Δt0 to Δt7 cause the pulse widths of the phase difference signals ΦP and ΦR provided to the charge pump 52 by the phase comparator 51 to be different from each other. As a result, even if the charge pump 52 is locked, the voltage signal Do varies. The variation in the voltage signal Do cannot be canceled by the LPF 53 that has a relatively small time constant. Therefore, the spurious level of the frequency signal fvco output from the VCO 54 falls. That is, the phase errors Δt0–Δt7 that are cyclically generated increase the spurious.

To suppress the spurious, the fractional-N-PLL frequency synthesizer 50 has a spurious cancel circuit 56 as shown in FIG. 1. The spurious cancel circuit 56 generates a cancel signal that has a phase opposite of that of the voltage signal Do, the latter varies with the phase errors Δt0–Δt7. More specifically, a digital-analog converter (not shown) of the spurious cancel circuit 56 receives a digital signal acquired by scaling the phase errors Δt0–Δt7 from the accumulator 55b and generates the cancel signal by performing a digital-analog conversion on the digital signal. The reason for using the digital signal of the accumulator 55b is that the digital signal is proportional to the phase errors Δt0–Δt7.

A variation in the voltage signal Do is canceled by superimposing the cancel signal from the spurious cancel circuit 56 onto the voltage signal Do. The variation-canceled voltage signal Do is then supplied to the VCO 54 via the LPF 53. As such, even if the phase errors Δt0 to Δt7 are generated cyclically, a spurious-reduced frequency signal fvco is output from the VCO 54.

However, since the spurious cancel circuit 56 has a digital-analog converter and an analog circuit, it is dependent upon the supply voltage and the temperature. Therefore, the spurious cancel circuit 56 is susceptible to variations in the supply voltage and temperature, and hence unable to generate a cancel signal that effectively reduces the spurious.

Further, the digital-analog converter and the analog circuit of the spurious cancel circuit 56 inevitably increase the circuit area and power consumption of the system.

SUMMARY OF THE INVENTION

Accordingly, it is an object of the present invention to provide a fractional-N-PLL frequency synthesizer that reduces the spurious caused by a phase error when it is locked.

In a first aspect of the present invention, a method of canceling a plurality of phase errors generated between a reference signal and a comparison signal when a fractional-NPLL frequency synthesizer is locked is provided. First, a reference phase error is determined from the plurality of phase errors. Then, any phase error equal to or smaller than the reference phase error is canceled.

In a second aspect of the present invention, an alternative method of canceling a plurality of phase errors generated between a reference signal and a comparison signal when a fractional-N-PLL frequency synthesizer is locked is provided. First, a reference phase error is determined from the plurality of phase errors. Second, a plurality of phase difference signals are generated according to the phase errors equal to or smaller than the reference phase error, wherein each phase difference signal has a pulse waveform.

Third, any phase error equal to or smaller than the reference phase error is canceled by canceling the pulse waveforms of the plurality of phase difference signals.

In a third aspect of the present invention, a fractional-N-PLL frequency synthesizer is provided. The synthesizer includes a phase comparator for generating a phase difference signal by comparing a reference signal with a comparison signal, and a charge pump for receiving the phase difference signal from the phase comparator and converting the phase difference signal into a voltage signal. A low-pass filter is connected to the charge pump to smooth the voltage signal so as to generate a voltage control signal. A voltage controlled oscillator is connected to the low-pass filter to generate a frequency signal having a frequency according to the voltage control signal. A variable frequency divider is connected to the voltage controlled oscillator to frequency-divide the frequency signal to generate the comparison signal. A plurality of phase errors including a predetermined reference phase error are generated between the reference signal and the comparison signal when the fractional-N-PLL frequency synthesizer is locked. A canceling circuit is connected to the variable frequency divider to cancel any phase error equal to or smaller than the predetermined reference phase error.

In a fourth aspect of the present invention, an alternative fractional-N-PLL frequency synthesizer is provided. The synthesizer includes a first phase comparator for generating a first phase difference signal by comparing a reference signal with a comparison signal, and a charge pump for receiving the first phase difference signal from the phase comparator and converting the first phase difference signal into a voltage signal. A low-pass filter is connected to the charge pump to smooth the voltage signal to generate a voltage control signal. A voltage controlled oscillator is connected to the low-pass filter to generate a frequency signal having a frequency according to the voltage control signal. A variable frequency divider is connected to the voltage controlled oscillator to frequency-divide the frequency signal, so to generate the comparison signal. A plurality of phase errors including a predetermined reference phase error are generated between the reference signal and the comparison signal when the fractional-N-PLL frequency synthesizer is locked. A selection circuit is connected to the variable frequency divider and the first phase comparator to distribute a first set of a reference signal and a comparison signal having no phase error therebetween, and a second set of a reference signal and a comparison signal having a phase error equal to or smaller than the predetermined reference phase error therebetween. The first set of reference and comparison signals is provided to the first phase comparator. A second phase comparator is connected to the selection circuit to receive the second set of reference and comparison signals and generate a second phase difference signal having a pulse waveform. A filter circuit is connected to the second phase comparator and the charge pump to delete the pulse waveform of the second phase difference signal and provide the pulse-waveform-deleted second phase difference signal to the charge pump.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may be best understood by reference to the description of the following exemplary embodiments together with the accompanying drawings in which.

4 is a timing chart of individual signals in the fractional-N-PLL frequency synthesizer of FIG. 3.

DETAILED DESCRIPTION OF THE PREFERRED EMBODIMENT

Figure 3:
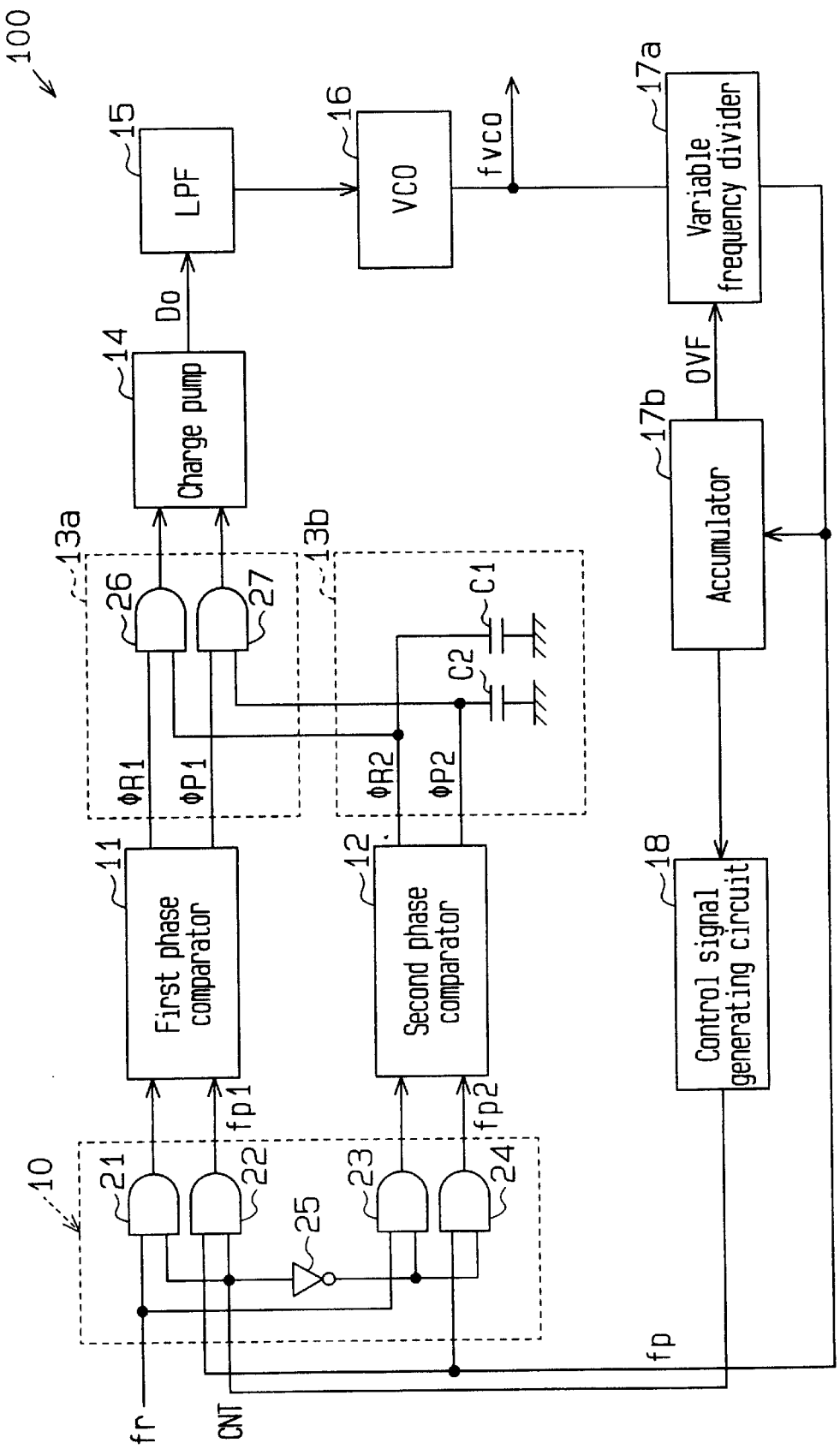
FIG. 3 is a schematic block diagram of a fractional-N-PLL frequency synthesizer according to an exemplary embodiment of the present invention.

As shown in FIG. 3, a fractional-N-PLL frequency synthesizer 100 according to an exemplary embodiment of the present invention includes a selection circuit 10, a first phase comparator 11, a second phase comparator 12, a logic circuit 13a, a filtering circuit 13b, a charge pump 14, a low-pass filter (LPF) 15, a voltage controlled oscillator (VCO) 16, a variable frequency divider 17a, an accumulator 17b, and a control signal generating circuit 18. The selection circuit 10, second phase comparator 12 and filtering circuit 13b form a canceling circuit. The frequency synthesizer 100 can be formed on a single semiconductor substrate.

The selection circuit 10 receives a reference signal fr and a comparison signal fp, and provides the reference signal fr and the comparison signal fp to either the first phase comparator 11 or the second phase comparator 12 in accordance with a control signal CNT from the control signal generating circuit 18. Specifically, the reference signal fr and the comparison signal fp are provided to the first phase comparator 11 when the control signal CNT has a high-potential level (high level), and are provided to the second phase comparator 12 when the control signal CNT has a low-potential level (low level).

The reference signal fr is generated by a reference frequency divider (not shown). The reference frequency divider generates the reference signal fr by frequency-dividing a clock signal generated by an oscillator (not shown) according to a predetermined frequency dividing ratio. The comparison signal fp is generated by the variable frequency divider 17a.

The selection circuit 10 includes four AND circuits 21 to 24 and one inverter circuit 25. The first AND circuit 21 is a 2-input AND circuit which receives the reference signal fr and the control signal CNT. The first AND circuit 21 provides the reference signal fr to the first phase comparator 11 when the control signal CNT has a high level. The first AND circuit 21 stops providing the reference signal fr to the first phase comparator 11 when the control signal CNT has a low level.

The second AND circuit 22 is a 2-input AND circuit which receives the comparison signal fp and the control signal CNT. The second AND circuit 22 provides the comparison signal fp to the first phase comparator 11 when the control signal CNT has a high level. The second AND circuit 22 stops providing the comparison signal fp to the first phase comparator 11 when the control signal CNT has a low level.

The third AND circuit 23 is a 2-input AND circuit which receives the reference signal fr and the control signal CNT that has been inverted by the inverter circuit 25. The third AND circuit 23 provides the reference signal fr to the second phase comparator 12 when the control signal CNT has a low level. The third AND circuit 23 stops providing the reference signal fr to the second phase comparator 12 when the control signal CNT has a high level.

The fourth AND circuit 24 is a 2-input AND circuit which receives the comparison signal fp and the control signal CNT that has been inverted by the inverter circuit 25. The fourth AND circuit 24 provides the comparison signal fp to the second phase comparator 12 when the control signal CNT has a low level. The fourth AND circuit 24 stops providing the comparison signal fp to the second phase comparator 12 when the control signal CNT has a high level.

The first phase comparator 11 generates phase difference signals ΦR1 and ΦP1 which have pulse waveforms according to the phase difference between the reference signal fr and the comparison signal fp. Specifically, when there is no phase difference between the reference signal fr and the comparison signal fp, the phase difference signals ΦR1 and ΦP1 fall and rise at the same time as the reference and comparison signals fr and fp. When the phase of the comparison signal fp leads to the phase of the reference signal fr, the phase difference signal ΦP1 falls earlier than the phase difference signal ΦR1 by a time that corresponds to the phase difference. The phase difference signals ΦR1 and ΦP1 rise simultaneously, nonetheless. When the phase of the reference signal fr leads to the phase of the comparison signal fp, the phase difference signal ΦR1 falls earlier than the phase difference signal ΦP1 by a time that corresponds to the phase difference. And the phase difference signals ΦR1 and ΦP1 also rise simultaneously. The first phase comparator 11 holds the phase difference signals ΦR1 and ΦP1 at high levels when comparison operation is not performed.

The second phase comparator 12 generates phase difference signals ΦR2 and ΦP2 which have pulse waveforms according to the phase difference between the reference signal fr and the comparison signal fp. Specifically, when there is no phase difference between the reference signal fr and the comparison signal fp, the phase difference signals ΦR2 and ΦP2 fall and rise at the same time as the reference and comparison signals fr and fp. When the phase of the comparison signal fp leads to the phase of the reference signal fr, the phase difference signal ΦP2 falls earlier than the phase difference signal ΦR2 by a time that corresponds to the phase difference. And the phase difference signals ΦR2 and ΦP2 rise simultaneously. When the phase of the reference signal fr leads to the phase of the comparison signal fp, the phase difference signal ΦR2 falls earlier than the phase difference signal ΦP2 by a time that corresponds to the phase difference. And the phase difference signals ΦR2 and ΦP2 rise simultaneously. The second phase comparator 12 holds the phase difference signals ΦR2 and ΦP2 at high levels when comparison operation is not performed.

The phase difference signals ΦR1 and ΦP1 from the first phase comparator 11 are provided to the logic circuit 13a, and the phase difference signals ΦR2 and ΦP2 from the second phase comparator 12 are provided to the logic circuit 13a via the filtering circuit 13b.

The logic circuit 13a includes a 2-input AND circuit 26, which receives the phase difference signal ΦR1 from the first phase comparator 11 and the phase difference signal ΦR2 from the second phase comparator 12, and a 2-input AND circuit 27, which receives the phase difference signal ΦP1 from the first phase comparator 11 and the phase difference signal ΦP2 from the second phase comparator 12. The AND circuit 26 provides the charge pump 14 with a low-level phase difference signal ΦR1 from the first phase comparator 11, or a phase difference signal ΦR2 whose pulse waveform has been deleted (filtered out) by the filtering circuit 13b. The AND circuit 27 provides the charge pump 14 with a low-level phase difference signal ΦP1 from the first phase comparator 11, or a phase difference signal ΦP2 whose pulse waveform has been deleted by the filtering circuit 13b.

The filtering circuit 13b, which is connected between the logic circuit 13a and the second phase comparator 12, includes two capacitors C1 and C2.

The capacitor C1 is connected between the ground and a node between the second phase comparator 12 and the AND circuit 26. The capacitor C1 absorbs the pulse waveform of the phase difference signal ΦR2 output from the second phase comparator 12. That is, a low-level pulse waveform of the phase difference signal ΦR2 (indicated by a two-dot chain line in FIG. 5) is deleted (filtered out) by the capacitor C1. Therefore, the phase difference signal ΦR2 held at a high level is provided to the AND circuit 26.

The capacitor C2 is connected between the ground and a node between the second phase comparator 12 and the AND circuit 27. The capacitor C2 absorbs the pulse waveform of the phase difference signal ΦP2 output from the second phase comparator 12. That is, a low-level pulse waveform of the phase difference signal ΦP2 (indicated by a dotted line in FIG. 5) is deleted (filtered out) by the capacitor C2. Therefore, the phase difference signal ΦP2 held at a high level is provided to the AND circuit 27.

The charge pump 14 receives the low-level phase difference signals ΦR1 and ΦP1, or the pulse-waveform-deleted phase difference signals ΦR2 and ΦP2 from the logic circuit 13a, and provides the LPF 15 with a voltage signal Do according to the phase difference signals ΦP1 and ΦR1 (or the phase difference signals ΦP2 and ΦR2). The LPF 15 smoothes the voltage signal Do from the charge pump 14 and provides a control voltage signal to the VCO 16.

The VCO 16 generates a frequency signal fvco corresponding to the voltage of the control voltage signal and provides the frequency signal fvco to an external circuit (not shown) and the variable frequency divider 17a. The variable frequency divider 17a frequency-divides the frequency signal fvco while changing the frequency dividing ratio from M division to M+1 division every time it receives an overflow signal OVF from the accumulator 17b, thereby generating the comparison signal fp. The accumulator 17b counts the comparison signal fp and provides the overflow signal OVF to the variable frequency divider 17a every time the count value overflows.

Figure 1:
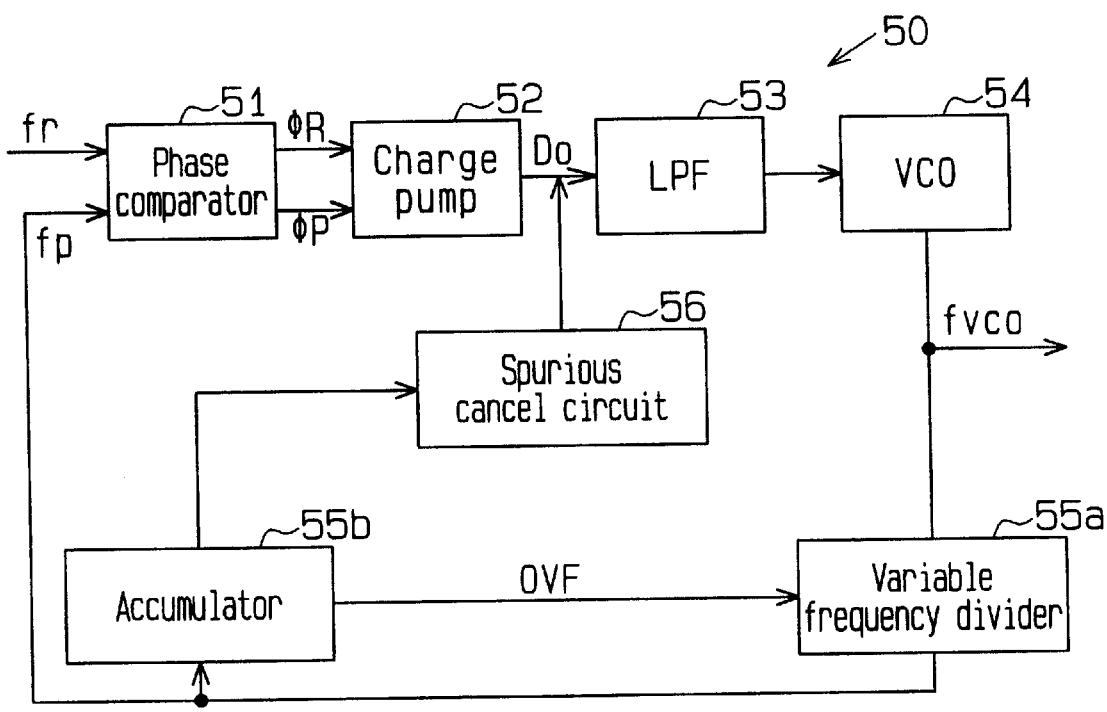
FIG. 1 is a schematic block diagram of a prior art fractional-N-PLL frequency synthesizer.
Figure 2:
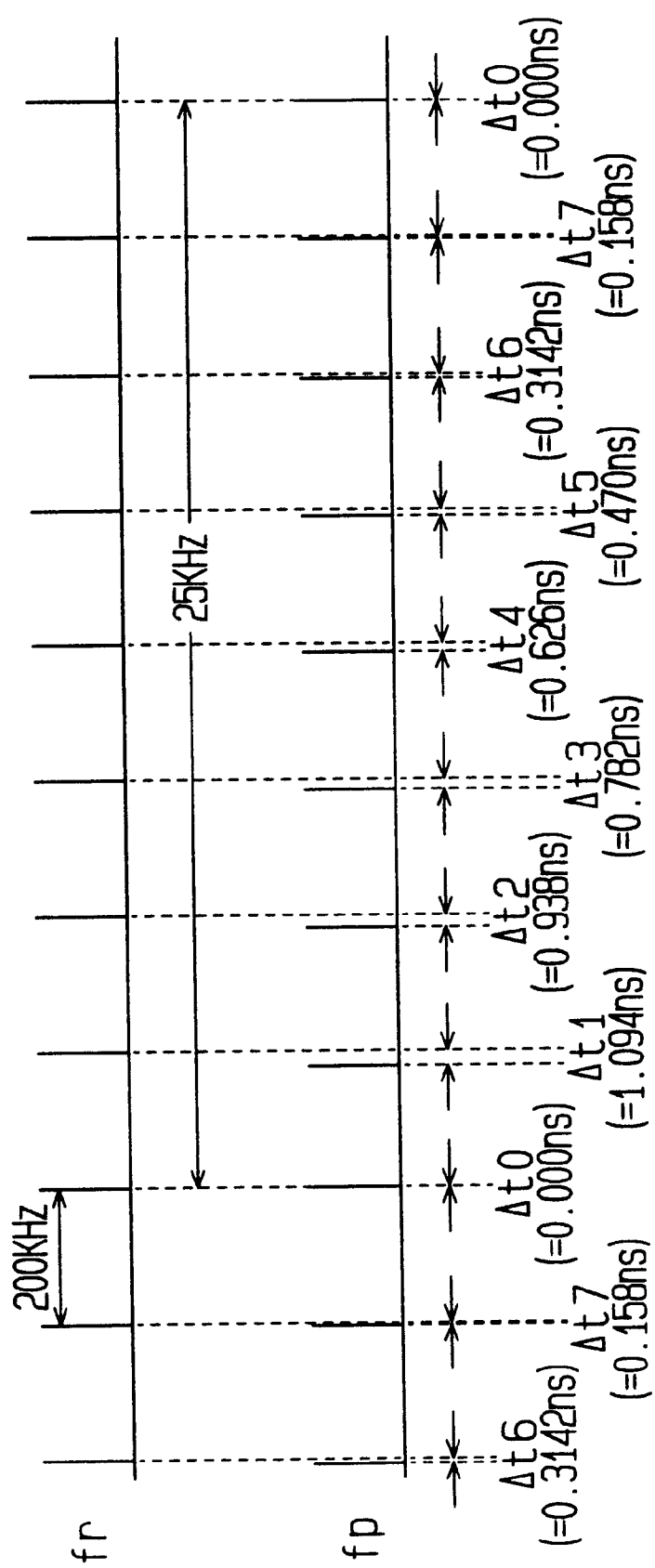
FIG. 2 is a timing chart of a reference signal and a comparison signal in the prior art synthesizer of FIG. 1.

The variable frequency divider 17a and the accumulator 17b have substantially the same configurations as the variable frequency divider 55a and the accumulator 55b of the fractional-N-PLL frequency synthesizer 50 shown in FIG. 1. Therefore, the fractional-N-PLL frequency synthesizer 100 can change the frequency signal fvco in finer steps than the reference signal fr. Because the fractional-N-PLL frequency synthesizer 100 performs fractional division (averaging of a frequency divided value) in an equivalent manner, phase errors Δt0 to Δt7 between the reference signal fr and the comparison signal fp are cyclically generated.

The capacitors C1 and C2 of the filtering circuit 13b have capacitances large enough to be able to absorb the pulse waveforms of the phase difference signals ΦR2 and ΦP2 that are associated with the largest phase error Δt1 (1.094 ns). The capacitors C1 and C2 therefore absorb all of the pulse waveforms of the phase difference signals ΦR2 and ΦP2 associated with any one of the phase errors Δt1 to Δt7 that is equal to or smaller than the phase error Δt1 (1.094 ns) now serving as a reference phase error.

The comparison signal fp output from the variable frequency divider 17a cyclically generates the phase errors Δt0–Δt7. The accumulator 17b acquires the timing of generating each of the phase errors Δt0–Δt7 based on the comparison signal fp from the variable frequency divider 17a, and provides a generation timing signal indicative of such timing to the control signal generating circuit 18. The control signal generating circuit 18 generates the control signal CNT supplied to the selection circuit 10, in accordance with the generation timing signal.

Figure 4:
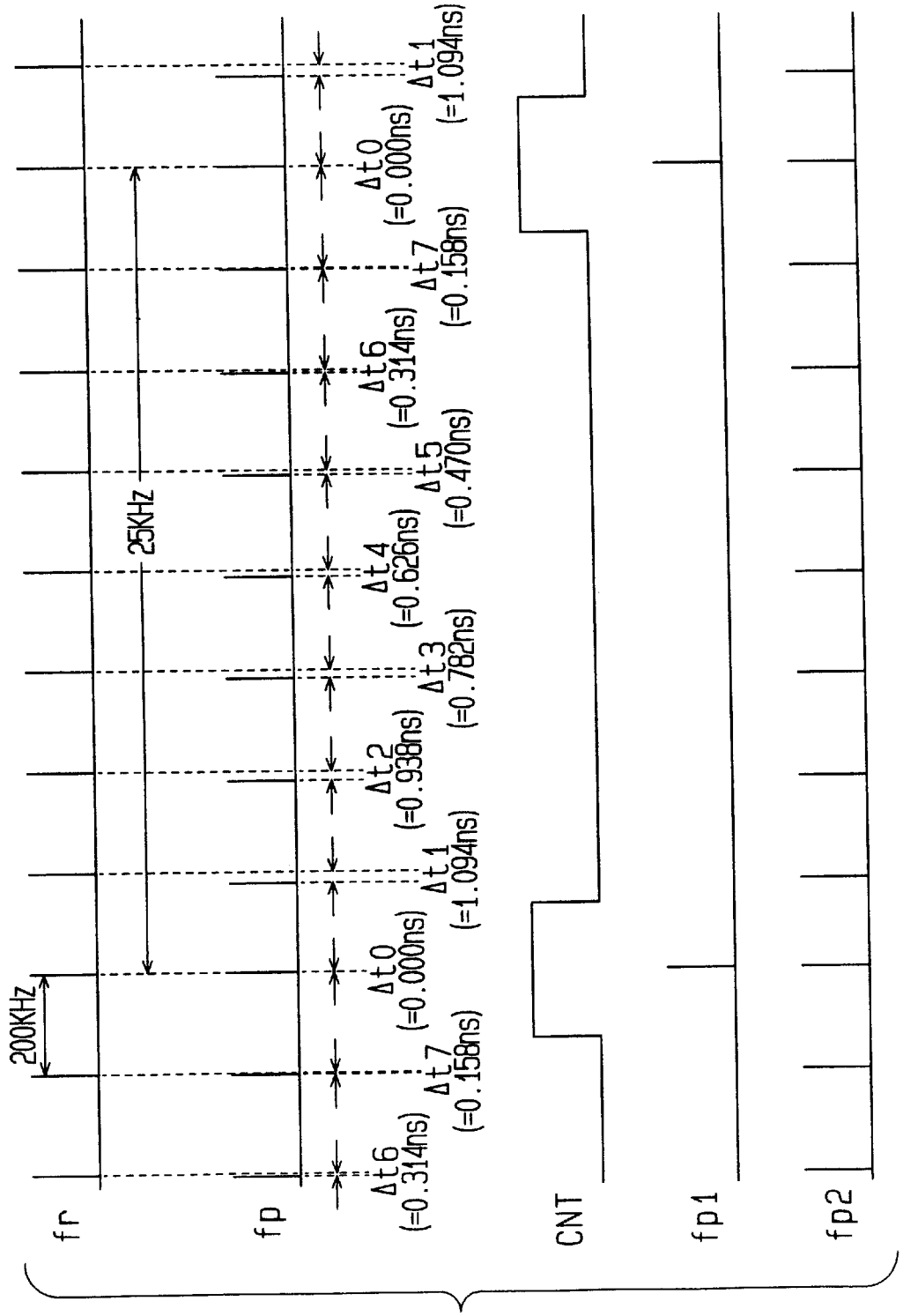

Based on the comparison signal fp, the control signal generating circuit 18 provides a high-level control signal CNT to the selection circuit 10, such that the reference signal fr and the comparison signal fp that have a phase error Δt0 (0.000 ns) are provided to the first phase comparator 11. Further, the control signal generating circuit 18 provides a low-level control signal CNT to the selection circuit 10, such that the reference signal fr and the comparison signal fp that have any one of the phase errors Δt1–Δt7 are supplied to the second phase comparator 12. That is, as shown in FIG. 4, the control signal generating circuit 18 generates the high-level control signal CNT when the reference signal fr and the comparison signal fp have the phase error Δt0 (0.000 ns). The control signal generating circuit 18 generates the low-level control signal CNT when the reference signal fr and the comparison signal fp have any one of the phase errors Δt1–Δt7.

The control signal generating circuit 18 generates the high-level control signal CNT after the variable frequency divider 17a outputs the comparison signal fp for generating the phase error Δt7 (0.158 ns) and before it outputs the comparison signal fp for generating the phase error Δt0 (0.000 ns). Further, the control signal generating circuit 18 generates the low-level control signal CNT after the variable frequency divider 17a outputs the comparison signal fp for generating the phase error Δt0 and before it outputs the comparison signal fp for generating the phase error Δt1 (1.094 ns).

The operation of the fractional-N-PLL frequency synthesizer 100 of FIG. 3 will now be described.

Suppose that the fractional-N-PLL frequency synthesizer 100 is locked, and the comparison signal fp that generates the cyclic phase errors Δt0–Δt7 with respect to the reference signal fr (as shown in FIG. 4) is output from the variable frequency divider 17a. In this situation, the control signal generating circuit 18 provides a high-level control signal CNT to the selection circuit 10 during a period from the time when the comparison signal fp for generating the phase error Δt7 (with respect to the reference signal fr) has been output to the time before the comparison signal fp for generating the phase error Δt1 is output. In other words, the control signal generating circuit 18 generates a high-level control signal CNT between a first time and a second time. The first time is defined from the point when the comparison signal fp for generating the phase error Δt7 (with respect to the reference signal fr) has been output to the point before the comparison signal fp for generating the phase error Δt0 is output. The second time is defined from the point when the comparison signal fp for generating the phase error Δt0 has been output to the time before the comparison signal fp for generating the phase error Δt1 is output.

Figure 5:
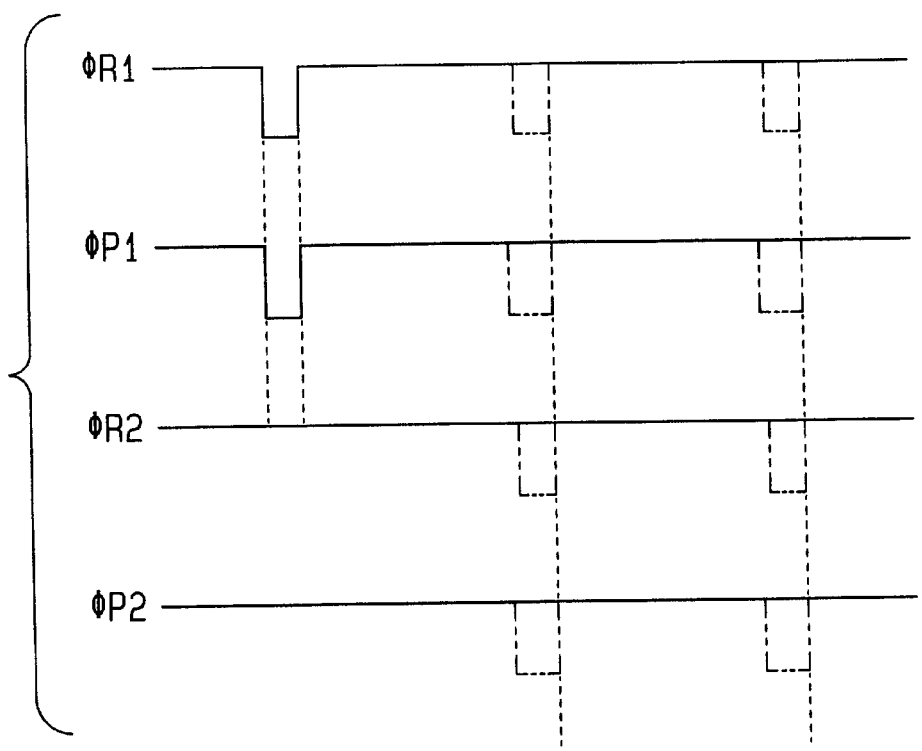
FIG. 5 is a waveform diagram of phase difference signals in the fractional-N-PLL frequency synthesizer of FIG. 3.

The first and second AND circuits 21 and 22 of the selection circuit 10 provide the reference signal fr and the comparison signal fp to the first phase comparator 11 in accordance with the high level control signal CNT. That is, the selection circuit 10 provides the first phase comparator 11 with the reference signal fr and the comparison signal fp (fp1) that have no phase error therebetween. As shown in FIG. 5, therefore, the first phase comparator 11 outputs the low level phase difference signals ΦR1 and ΦP1 that fall and rise at the same time.

When the control signal CNT is at the high level, the reference signal fr and the comparison signal fp that have no phase error therebetween are not provided to the second phase comparator 12 from the third and fourth AND circuits 23 and 24. Therefore, the second phase comparator 12 will not output the low-level phase difference signals ΦR2 and ΦP2.

The low-level phase difference signals ΦR1 and ΦP1 output from the first phase comparator 11 are provided to the charge pump 14 via the AND circuits 26 and 27 of the logic circuit 13a. That is, the charge pump 14 receives the low-level phase difference signals ΦR1 and ΦP1 when the reference signal fr and the comparison signal fp have the phase error Δt0 (0.000 ns).

Next, the control signal generating circuit 18 provides a low-level control signal CNT to the selection circuit 10 during a period from the time before the comparison signal fp for generating the phase error Δt1 (with respect to the reference signal fr) is output to the time before the comparison signal fp for generating the phase error Δt0 is output. In other words, the control signal generating circuit 18 generates a low-level control signal CNT between a third time and a fourth time. The third time is defined from the point when the comparison signal fp for generating the phase error Δt0 (with respect to the reference signal fr) has been output to the point before the comparison signal fp for generating the phase error Δt1 is output. The fourth time is defined from the point when the comparison signal fp for generating the phase error Δt7 has been output to the time before the comparison signal fp for generating the phase error Δt0 is output.

The third and fourth AND circuits 23 and 24 of the selection circuit 10 provide the reference signal fr and provide the comparison signal fp to the second phase comparator 12 in accordance with the low level control signal CNT. That is, the selection circuit 10 provides the second phase comparator 12 with the reference signal fr and the comparison signal fp (fp2) that have any one of the phase errors Δt1–Δt7 therebetween. Therefore, the second phase comparator 12 outputs the low-level phase difference signals ΦR2 and ΦP2 that fall at different times and rise simultaneously.

When the control signal CNT is at the low level, the reference signal fr and the comparison signal fp that have any one of the phase errors Δt1–Δt7 therebetween are not provided to the first phase comparator 11 from the first and second AND circuits 21 and 22 of the selection circuit 10. Therefore, the first phase comparator 11 will not output the low-level phase difference signals ΦR1 and ΦP1 that have the same waveforms as those of the low-level phase difference signals ΦR2 and ΦDP2 (indicated by two dotted lines in FIG. 5).

The pulse waveforms of the phase difference signals ΦR2 and ΦP2 output from the second phase comparator 12 are absorbed by the capacitors C1 and C2 of the filtering circuit 13b, so that the high-level phase difference signals ΦR2 and ΦP2 are supplied to the charge pump 14 via the AND circuits 26 and 27 of the logic circuit 13a. That is, the pulse waveforms of the low-level phase difference signals ΦR2 and ΦP2 (indicated by the two dotted lines in FIG. 5) based on the reference signal fr and the comparison signal fp that generate the phase errors Δt1–Δt7 are deleted (filtered out) by the capacitors C1 and C2. In other words, all of the pulse waveforms of the phase difference signals ΦR2 and ΦP2 corresponding to the phase errors Δt1–Δt7 that are equal to or smaller than the phase error Δt1 (1.094 ns) are canceled.

Accordingly, only the low-level phase difference signals ΦP1 and ΦR1 from the first phase comparator 11 are provided to the charge pump 14 and the low level phase difference signals ΦP2 and ΦR2 from the second phase comparator 12 are not supplied, so that the voltage signal Do does not vary. That is, even if the cyclic phase errors Δt0–Δt7 are generated in the locked state, the charge pump 14 outputs a voltage signal Do that does not vary.

The LPF 15 smoothes the voltage signal Do from the charge pump 14 and provides the control voltage signal to the VCO 16. The VCO 16 generates the frequency signal fvco corresponding to the voltage of the control voltage signal and provides the frequency signal fvco to the external circuit and the variable frequency divider 17a. As such, even if the phase errors Δt1 to Δt7 are generated, the VCO 16 outputs the spurious-reduced frequency signal fvco. The variable frequency divider 17a frequency-divides the frequency signal fvco while changing the frequency dividing ratio in accordance with the overflow signal OVF from the accumulator 17b, and provides the comparison signal fp to the selection circuit 10. The same operation as discussed above is repeated in the locked state.

The fractional-N-PLL frequency synthesizer 100 according to the present invention has the following advantages.

(1) The capacitors C1 and C2 of the filtering circuit 13b have capacitances large enough to be able to cancel (filter out) the pulse waveforms of the phase difference signals ΦR2 and ΦP2 that are based on the reference signal fr and the comparison signal fp having the largest phase error Δt1. That is, the capacitors C1 and C2 cancel (filter out) all of the pulse waveforms of the phase difference signals ΦR2 and ΦP2 that are based on the reference signal fr and the comparison signal fp having any one of the phase errors Δt1 to Δt7. In contrast to the prior art, the present invention need not generate a cancel signal having a waveform for canceling each phase error, and is therefore able to cancel the phase errors in a simple and effective way.

(2) In the locked state, the reference signal fr and the comparison signal fp that have no phase error (phase error Δt0 (0.000 ns)) therebetween are provided as the phase difference signals ΦR1 and ΦP1 to the charge pump 14 via the first phase comparator 11. The reference signal fr and the comparison signal fp that have any one of the phase errors Δt1 to Δt7 therebetween are provided to the second phase comparator 12 from the selection circuit 10. The phase difference signals ΦR2 and ΦP2 output from the second phase comparator 12 are canceled by the capacitors C1 and C2 of the filtering circuit 13b.

As such, even if the phase errors Δt1 to Δt7 are generated cyclically in the locked state, the charge pump 14 receives the phase difference signals ΦR1 and ΦP1 based on the reference signal fr and the comparison signal fp that have no phase error therebetween, and outputs the voltage signal Do that does not vary. As a result, the VCO 16 outputs a spurious-reduced frequency signal fvco, even if the phase errors Δt1 to Δt7 are generated.

(3) The filtering circuit 13b having the capacitors C1 and C2 has an extremely small productional variation, and low dependency on the supply voltage and temperature as compared with the prior art spurious cancel circuit 56. The spurious can therefore be reduced effectively without being influenced by a productional variation, a variation in supply voltage, or a variation in temperature.

(4) The selection circuit 10, the second phase comparator 12 and the filtering circuit 13b as a whole have a smaller circuit area and lower power consumption than the spurious cancel circuit 56 in the prior art, since the latter has a digital-analog converter and an analog circuit.

(5) The design of the logic circuit 13a allows a single charge pump 14 to produce the voltage signal Do, which reduces the circuit area.

It should be apparent to those skilled in the art that the present invention may be embodied in many other alternative forms without departing from the principle and the scope of the present invention. Particularly, it should be understood that the invention may be embodied in the following forms.

(a) The filtering circuit 13b may use variable capacitors instead of the fixed capacitors C1 and C2. Each of the phase errors Δt1 to Δt7 is determined by the status of the PLL frequency synthesizer, such as variations in the reference signal fr, the denominator of the frequency dividing ratio, and/or the lock frequency. The spurious can therefore be reduced more effectively by changing the capacitances of the variable capacitors in accordance with the status of the PLL frequency synthesizer. The variable capacitors may be configured by using a plurality of parallel-connected capacitors and an analog switch for selecting the capacitors.

(b) The reference signal fr and the comparison signal fp that generate, for example, the phase error Δt0 and the phase error Δt7 may be provided to the first phase comparator 11. The reference signal fr and the comparison signal fp that generate the phase errors Δt1 to Δt6 may be provided to the second phase comparator 12.

(c) The control signal generating circuit 18 may generate the control signal in accordance with a timing detection signal from a circuit that detects the timing of generating each of the phase errors Δt0 to Δt7, instead of the timing signal produced by the accumulator 17b.

(d) The canceling circuit is not limited to the one that includes the second phase comparator 12 and the filtering circuit 13b, but can be any circuit that cancels any phase error equal to or smaller than the reference phase error when the fractional-N-PLL frequency synthesizer is locked.

Therefore, the present examples and embodiments are to be considered as illustrative and not restrictive and the invention is not to be limited to the details given herein, but may be modified within the scope and equivalence of the appended claims.

What is claimed is:

1. A method of canceling a plurality of phase errors generated between a reference signal and a comparison signal when a fractional-N-PLL frequency synthesizer is locked, comprising the steps of:
   determining a reference phase error from the plurality of phase errors; and
   canceling any of the plurality of phase errors equal to or smaller than the reference phase error.

2. The method according to claim 1, further comprising the step of generating a phase difference signal according to a phase difference between the reference signal and the comparison signal;
   wherein the phase error canceling step includes canceling a plurality of phase difference signals generated according to phase errors equal to or smaller than the reference phase error.

3. The method according to claim 2, wherein the reference phase error is a largest phase error among the plurality of phase errors.

4. A method of canceling a plurality of phase errors generated between a reference signal and a comparison signal when a fractional-N-PLL frequency synthesizer is locked, comprising the steps of:

determining a reference phase error from the plurality of phase errors;

generating a plurality of phase difference signals according to phase errors equal to or smaller than the reference phase error, each phase difference signal having a pulse waveform; and canceling any of the plurality of phase errors equal to or smaller than the reference phase error by canceling pulse waveforms of the plurality of phase difference signals.

5. The method according to claim 4, wherein the reference phase error is a largest phase error among the plurality of phase errors.

6. The method according to claim 4, wherein the phase error canceling step includes canceling any of the plurality of phase errors equal to or smaller than the reference phase error by deleting the pulse waveforms of the plurality of phase difference signals using a capacitor.

7. The method according to claim 4, further comprising the step of changing the reference phase error in accordance with a state of the fractional-N-PLL frequency synthesizer.

8. A fractional-N-PLL frequency synthesizer comprising:

a phase comparator for generating a phase difference signal by comparing a reference signal with a comparison signal;

a charge pump for receiving the phase difference signal from the phase comparator and converting the phase difference signal into a voltage signal;

a low-pass filter, connected to the charge pump, for smoothing the voltage signal to generate a voltage control signal;

a voltage controlled oscillator, connected to the low-pass filter, for generating a frequency signal having a frequency according to the voltage control signal;

a variable frequency divider, connected to the voltage controlled oscillator, for frequency-dividing the frequency signal to generate the comparison signal, a plurality of phase errors including a predetermined reference phase error generated between the reference signal and the comparison signal when the fractional-N-PLL frequency synthesizer is locked; and a canceling circuit, connected to the variable frequency divider, for canceling any of plurality of phase errors equal to or smaller than the predetermined reference phase error.

9. A fractional-N-PLL frequency synthesizer comprising:

a first phase comparator for generating a first phase difference signal by comparing a reference signal with a comparison signal;

a charge pump for receiving the first phase difference signal from the phase comparator and converting the first phase difference signal into a voltage signal;

a low-pass filter, connected to the charge pump, for smoothing the voltage signal so to generate a voltage control signal;

a voltage controlled oscillator, connected to the low-pass filter, for generating a frequency signal having a frequency according to the voltage control signal;

a variable frequency divider, connected to the voltage controlled oscillator, for frequency-dividing the frequency signal to generate the comparison signal, a plurality of phase errors including a predetermined reference phase error generated between the reference signal and the comparison signal when the fractional-N-PLL frequency synthesizer is locked;

a selection circuit, connected to the variable frequency divider and the first phase comparator, for distributing a first set of the reference and comparison signals that have no phase error therebetween and a second set of the reference and comparison signals that have a phase error equal to or smaller than the predetermined reference phase error therebetween, wherein the first set of the reference and comparison signals are provided to the first phase comparator;

a second phase comparator, connected to the selection circuit, for receiving the second set of the reference and comparison signals and generating a second phase difference signal having a pulse waveform; and a filter circuit, connected to the second phase comparator and the charge pump, for deleting the pulse waveform of the second phase difference signal and providing the pulse-waveform-deleted second phase difference signal to the charge pump.

10. The fractional-N-PLL frequency synthesizer according to claim 9, wherein the filter circuit includes a capacitor.

11. The fractional-N-PLL frequency synthesizer according to claim 10, wherein the capacitor has a capacitance large enough to delete the pulse waveform of the second phase difference signal that corresponds to the reference phase error.

12. The fractional-N-PLL frequency synthesizer according to claim 10, wherein the capacitor is a variable capacitor.

13. The fractional-N-PLL frequency synthesizer according to claim 12, wherein a capacitance of the variable capacitor is changed in accordance with a state of the fractional-N-PLL frequency synthesizer.

14. The fractional-N-PLL frequency synthesizer according to claim 9, further comprising a logic circuit, connected to the filter circuit and between the first phase comparator and the charge pump, for selectively providing the first phase difference signal and the pulse-waveform-deleted second phase difference signal to the charge pump.

15. The fractional-N-PLL frequency synthesizer according to claim 9, further comprising a control signal generating circuit, connected to the selection circuit, for generating a control signal such that the first set of the reference and comparison signals and the second set of the reference and comparison signals are distributed in accordance with times of generating the plurality of phase errors and for providing the control signal to the selection circuit.

16. The fractional-N-PLL frequency synthesizer according to claim 15, further comprising an accumulator, connected to the control signal generating circuit and the variable frequency divider, for receiving the comparison signal from the variable frequency divider, acquiring generating times of the plurality of phase errors based on the comparison signal, and providing a signal indicative of the generating times to the control signal generating circuit.

* * * * *